(12) United States Patent
Farooq et al.

(10) Patent No.: US 7,473,580 B2
(45) Date of Patent: Jan. 6, 2009

(54) TEMPORARY CHIP ATTACH USING INJECTION MOLDED SOLDER

(75) Inventors: Mukta Ghate Farooq, Hopewell Junction, NY (US); Thomas J Fleischman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 11/419,069

(22) Filed: May 18, 2006

(65) Prior Publication Data
US 2007/0269928 A1 Nov. 22, 2007

(51) Int. Cl.
| H01L 21/50 | (2006.01) |
| H01L 21/48 | (2006.01) |
| H01L 21/44 | (2006.01) |
| H01L 23/52 | (2006.01) |
| H01L 23/48 | (2006.01) |
| H01L 23/40 | (2006.01) |
| H01L 23/485 | (2006.01) |
| H01L 23/498 | (2006.01) |

(52) U.S. Cl. .................. 438/108; 438/612; 438/613; 257/778; 257/779; 257/780; 257/E23.021; 257/E23.069

(58) Field of Classification Search .................. 438/108, 438/612, 613; 257/778, 779, 780, E23.021, 257/E23.069
See application file for complete search history.

(56) References Cited

U.S. PATENT DOCUMENTS

| 5,640,052 A | * | 6/1997 | Tsukamoto | 257/781 |
| 5,854,558 A | * | 12/1998 | Motooka et al. | 324/754 |
| 6,249,051 B1 | * | 6/2001 | Chang et al. | 257/737 |
| 6,483,195 B1 | * | 11/2002 | Aoki et al. | 257/778 |
| 6,878,633 B2 | * | 4/2005 | Raskin et al. | 438/694 |

* cited by examiner

Primary Examiner—Luan Thai
(74) Attorney, Agent, or Firm—Howard M. Cohn; James J. Cioffi; Rosa Suazo Yaghmour

(57) ABSTRACT

An improved method for performing an improved Temporary Chip Attach utilizing an Injection Molded Solder (IMS) process to allow efficient testing of die for creating a Known Good Die Bank. The IMS is applied to the testing substrate to form a column on the substrate. The die to be tested can then be attached to the IMS column with C4 solder. A slight reflow is then applied to the die, allowing some of the C4 to melt, and form an electrical connection with the corresponding IMS column. After testing, the die can be removed along with the C4 from the IMS column or permanently attached the substrate by performing a full reflow of the C4.

19 Claims, 8 Drawing Sheets

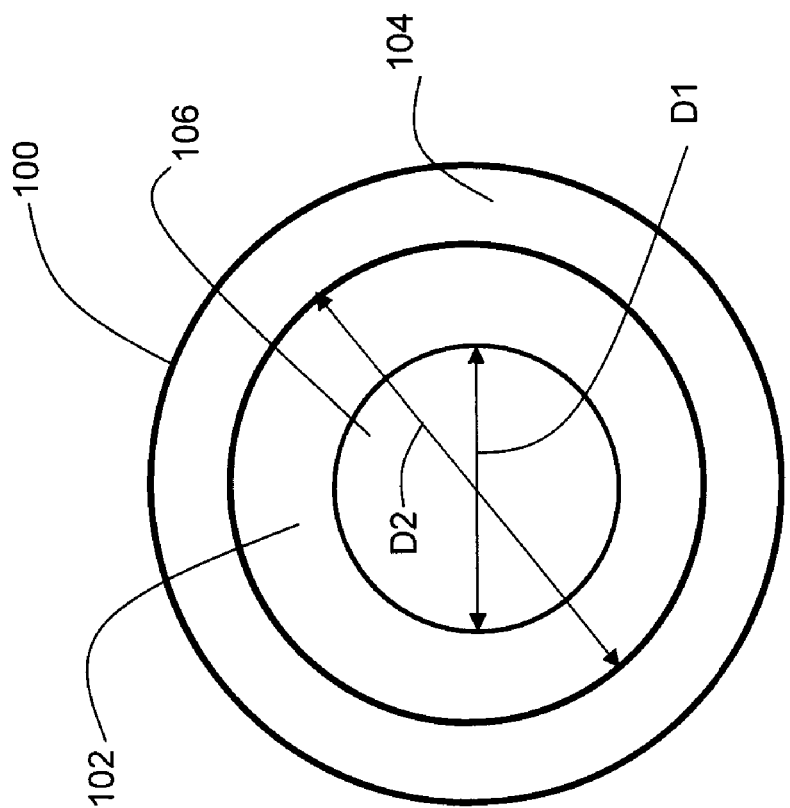
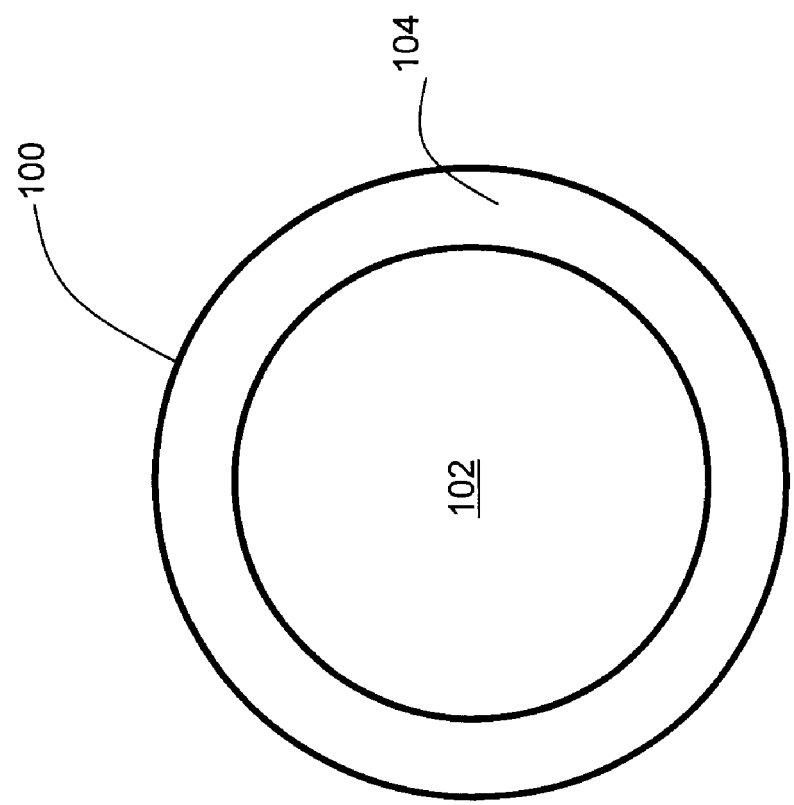
FIG. 1B
FIG. 1A

TEMPORARY CHIP ATTACH USING INJECTION MOLDED SOLDER

FIELD OF THE INVENTION

The present invention generally relates to semiconductor manufacturing methods. More particularly, the present invention relates to temporary electrical connections for use in temporary chip attach applications.

BACKGROUND

In the microelectronics industry, there are Known-Good-Die (KGD) chips, which are die (chips) that have been tested and burned-in, and are known to be good prior to sale. Moreover, it is necessary that chips used to populate a multi-chip module (MCM) be (KGD) chips prior to being placed on the MCM, so that it is not necessary to reflow the module excessive times to replace die (chips) that may be defective.

One method of producing KGD chips is to test the die on an Alumina Based Ceramic carrier. The Alumina Based Ceramic carrier can be a standard single-chip substrate. If the tested die is found to be good, the die is removed and put in a Known-Good-Die bank. The Alumina Based Ceramic, standard single-chip substrate is then cleaned and re-used.

Conventional methods such as the flip-chip attach are common in the electronics industry. However, problems arise when a chip is temporarily mounted on a carrier with chip solder balls to provide sufficient electrical connectivity to facilitate test and burn-in at elevated temperatures. One problem is that it is difficult to then remove the chip from the Temporary Chip Attach (TCA) carrier (substrate) without damage to the chip solder balls or the carrier. Glass ceramic based carriers are much more fragile then alumina based Ceramic based carriers and it is even more difficult for them to withstand the removal process.

In order to serve as a Temporary Chip Attach (TCA) substrate, a standard substrate is put through a special process flow which reduces the solder area, thus minimizing the joint strength, and allowing for easy removal of the die when the testing is complete.

The process to convert a standard substrate to a TCA substrate is expensive, complicated, and not well defined or controlled. First, only alumina based substrates can be readily used. If the original application was for use on a glass ceramic substrate, then the testing results for the die on an alumina based substrate may not match the die performance when placed on the glass ceramic substrate due to differences arising from substrate contributions. The inaccuracies in the testing results can cause improper sorting of the tested die. Special mask and process steps need to be added to the standard substrate during manufacturing flow to convert it to a TCA substrate. This special processing and design work is expensive and time consuming. Therefore, what is needed is an improved technique for performing Temporary Chip Attach.

SUMMARY OF INVENTION

According to the present invention, a method of attaching a chip to a substrate comprises the steps of: forming at least one substrate pad on the substrate by applying a ring of high temperature solder to said substrate to form an outer region of high temperature solder; applying low temperature solder within said outer region of high temperature solder to form an inner region of low temperature solder; placing one end of an injection molded solder column on the inner region of said substrate pad, whereby said column does not contact said outer region; mounting said chip onto an opposite end of the injection molded solder column with a C4 solder ball whereby the chip makes electrical contact with the injection molded solder column; and performing a partial reflow at a temperature between about 150° C. and 227° C. whereby said C4 solder wets both the inner and outer regions of the substrate pad and forms a joint between the inner region and the lower side wall of the injection molded solder column.

Further according to the present invention, the method comprises the steps of testing said chip, and then removing said chip from the injection molded solder columns.

Still further according to the present invention, the method comprises the steps of testing said chip, and then performing a complete reflow of said chip at a temperature between about 150° C. and 227° C., thereby permanently attaching said chip to the injection molded solder column.

Yet further according to the present invention, the method comprises an additional step of depositing an intermediate material of a low temperature solder having a lower melting point than C4 solder ball on the injection molded column between the column and the C4 solder ball.

According to the present invention, the injection molded solder column is a composition of between 90.0 to 97.0% Pb; between 10.0 to 3.0% Sn; and having a melting temperature greater than about 300° C.

Further according to the present invention, the electrical contacts of said chip are comprised of a solder, wherein said solder composition is about 63.0% Sn and 37% Pb; and having a melting temperature less than about 220° C.

Yet further according to the present invention, the injection molded solder column is a formed from a composition of 80.0% Au and 20% Sn and has a melting temperature greater than about 280° C.

Still further according to the present invention, the injection molded solder column is formed from the group of materials consisting essentially of SnAgCu, SnCu, and SnAg; and has a melting temperature greater than about 217° C.

Also according to the present invention, the electrical contacts of said chip are formed from the group of materials consisting essentially of SnZn, SnBi, and SnIn; and having a melting temperature greater than about 150° C. and less than about 180° C.

Also according to the present invention, the electrical contacts of said chip are formed from the group of materials consisting essentially of SnAgCu, SnCu, SnAg, SnAgIn, SnBi, SnZn, and SnIn; and having a melting temperature greater than about 150° C. and less than about 227° C.

In another aspect of the invention, the electrical contacts of said chip are formed from the group of materials consisting essentially of SnAgCu, SnCu, SnAg, SnAgIn, SnBi, SnZn, and SnIn; and having a melting temperature greater than 150° C. and less than 227° C.

In another aspect of the invention, the intermediate material is formed from the group of materials consisting essentially of SnZn, SnBi, and SnIn; and having a melting temperature greater than 150° C. and less than 180° C.

In another aspect of the invention, the step of removing said chip from the injection molded solder columns is performed by a shear method.

In another aspect of the invention, the step of removing said chip from the injection molded solder columns is performed by a pull method.

In another aspect of the invention, the high temperature solder is a composition consisting essentially of: between 90.0 to 97.0% Pb; between 10.0 to 3.0% Sn; and having a melting temperature greater than 300° C.

In another aspect of the invention, the high temperature solder is a composition consisting essentially of: 80.0% Au; 20% Sn; and having a melting temperature greater than 280° C.

In another aspect of the invention, the high temperature solder is formed from the group of materials consisting essentially of SnAgCu, SnCu, and SnAg; and having a melting temperature greater than 217° C.

According to the present invention, a structure for attaching a chip to a substrate comprises a bottom end of an injection molded solder column disposed on a substrate. The solder column is of a first solder having a high melting temperature. A chip is mounted onto an opposite top end of the injection molded solder column with a second solder having a lower melting temperature than the first solder. The second solder is disposed about a side wall of the injection molded solder column so as to form a joint between the substrate and the side wall of the injection molded solder column.

Also according to the present invention, a ring of a high temperature third solder is disposed on the substrate to form an outer region disposed about and spaced from the side wall of the injection molded solder column so as to prevent the low temperature second solder to flow across the substrate beyond the outer region.

By employing the method of the present invention, the required time, and complexity of performing Temporary Chip Attach is reduced, thereby reducing the time and complexity required to test a die. This will be evident from the detailed description and drawings of exemplary embodiments that follow.

BRIEF DESCRIPTION OF DRAWINGS

FIG. 1A shows the top view of a substrate pad modified, in accordance with the present invention;

FIG. 1B shows the top view of a modified substrate pad with an IMS column attached thereon, in accordance with the present invention;

DETAILED DESCRIPTION OF PREFERRED EMBODIMENTS

Figure 2:
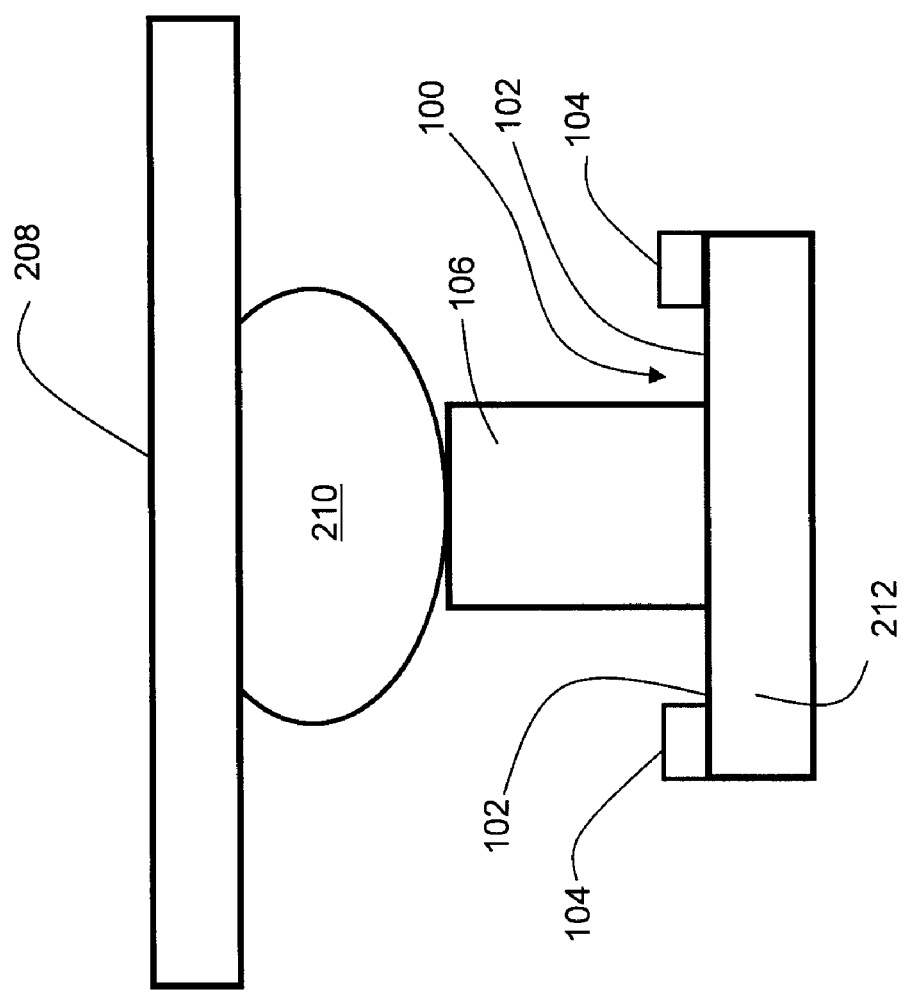
FIG. 2 shows a side view of a die placed on a substrate, in accordance with the present invention.

Injection Molded Solder (IMS) is a technology which allows precisely sized and shaped interconnects to be formed. The present invention uses an IMS process in place of the current Temporary Chip Attach (TCA) fabrication process to create the TCA substrate.

An injection molded solder (IMS) process allows the controlled filling of cavities of a mold with molten solder or solder alloys of any composition. It is accomplished by using an IMS head where the solder is loaded and melted first and then placed tightly against a mold surface and glided across the surface. A vacuum channel is provided ahead of the solder slot such that the mold cavities are under vacuum. Molten solder then runs quickly into the cavities that are under vacuum and filling the cavities. After the cavities are filled and the mold is cooled and inspected, the IMS is ready for transfer to a mating surface on a substrate.

The dies that are to be tested using a TCA process may employ an interconnect technology of C4 (controlled collapse chip connection) which is a method of using a lead/tin or other alloys to mount chips directly to high temperature ceramic substrates. The so-called C4 flip chip structures can be built directly over exposed aluminum vias located at the top surface of a die. The flip chip structure consists of a ball limiting metallurgy (BLM) and an electrical contact. The electrical contact typically comprises a solder ball or solder bump. The BLM provides a conductive path between solder and the wiring exposed through vias in the die. The BLM structure also seals the vias and thus provides a restricted solderable area such that the die surface outside the BLM regions is protected by either a glass or a polymer film to limit the lateral flow of solder during subsequent reflow process. An IMS column structure during chip interconnect can thus be assured. IMS techniques are known in the art. Various patents disclose such techniques, including the following U.S. Patents, all of which are incorporated herein by reference: U.S. Pat. No. 5,244,143; U.S. Pat. No. 5,775,569; U.S. Pat. No. 6,105,852; U.S. Pat. No. 6,127,735; U.S. Pat. No. 6,133,633; U.S. Pat. No. 6,149,122; U.S. Pat. No. 6,231,333; U.S. Pat. No. 6,332,569; and U.S. Pat. No. 6,340,630.

The present invention utilizes an IMS process to perform TCA in an efficient manner, thereby allowing efficient testing of die to create a Known-Good-Die bank. The IMS is applied to the testing substrate, which may be the actual final substrate, thereby forming a column on the substrate.

In one embodiment of the present invention, the die to be tested is placed on the IMS columns, such that the C4 solder balls of the die are aligned above a corresponding IMS column. A slight reflow is then applied to the die, allowing some of the C4 to melt, and form an electrical connection with the corresponding IMS column. After test, if the die is to be removed from the substrate, a removal method such as shear, or slight reflow and pull can be applied to remove the die along with the C4 from the IMS column. If it is desired to permanently attach the die to the substrate, this is easily accommodated with the present invention by performing a full reflow of the C4. The C4 will flow around the column and join with the substrate.

Most solder metals are alloys, or combinations of pure elements or materials. Alloys have very different melting characteristics compared to their pure metal forms. Most alloys do not have a single melting temperature or melting point; instead they have a melting range. The upper and lower limits of this range are called the liquidus and solidus temperatures, respectively. The solder begins to melt at its solidus temperature and continues to melt until it reaches the liquidus temperature, where it is completely molten. The difference between the solidus and liquidus temperatures is referred to as the gap. Some solder alloys have a large gap, whereas others have a small or virtually non-existent gap. With a large gap, the application of C4 solder bumps directly to the IMS column is feasible because the amount of reflow is easily controlled. If a solder alloy with a small or non-existent gap is used, controlling the amount of reflow can be difficult. In the latter case, using an intermediate material in between the C4 and the IMS column can provide a TCA connection. The intermediate material is typically applied on top of the IMS column as a subsequent deposition. Therefore, the present invention can accomplish the desired result with a wide variety of solder alloys.

For the purposes of this disclosure, the following alloys are defined below:

SnAgCu (2.0 to 4.0% Ag, 0.2 to 1.0% Cu, balance Sn), hereinafter referred to as SnAgCu;

SnCu (0.2 to 1.0% Cu, balance Sn), hereinafter referred to as SnCu;

SnAg (2.0 to 4.0% Ag, balance Sn), hereinafter referred to as SnAg;

SnAgIn (10 to 20% In, 3% Ag, balance Sn), hereinafter referred to as SnAgIn;

SnBi (~57% Bi, balance Sn), hereinafter referred to as SnBi;

SnZn (~9% Zn, balance Sn), hereinafter referred to as SnZn; and

SnIn (~52% In, balance Sn), hereinafter referred to as SnIn.

Referring now to FIG. 1A, a substrate pad 100 formed on a substrate 212 is shown. A ring of high temperature solder is applied to the substrate to form an outer region 104 around the circumference of the pad 100. A low temperature solder is applied to the substrate within the outer region 104 to create an inner region 102. The purpose of the outer region 104 is to serve as a solder dam for the low temperature solder that joins an IMS column 106 (see FIG. 1B) to the inner region 102 of substrate pad 100 and for the C4 solder described below. While a single pad 100 is illustrated, it is within the terms of the invention to provide one or more pads 100 on a substrate 212, as shown in FIG. 2.

Referring now to FIG. 1B, the IMS column 106 has a diameter D1 that is smaller than the diameter D2 of the inner region 102. The IMS column 106 is attached to the approximate center of substrate pad 100 (as shown in FIG. 2) so that the bottom end of the column is attached to the inner region 102. The IMS column 106 is disposed on the inner region so as not to contact the outer region 104.

Referring to FIG. 2, a die 208 is mounted to column 106 with a C4 solder ball 210. When reflowed, by heating the substrate 212, the column 106, the C4 solder ball and the chip to a temperature of between about 150° C. and about 227° C., the C4 solder ball 210 flows down the side wall of IMS column 106 and wets the inner region 102 and the edge of the solder dam forming outer region 104 of substrate pad 100. This provides a higher strength joint between the lower side wall of column 106 and the inner region 102 to thereby increase the reliability of the joint, and thus the overall device reliability. The IMS column 106 is made of a material, such as is made of high lead solder, such as Pb/Sn: 90/10, 95/5, or 97/3, with a higher melting point than the C4 solder balls 210 that are attached to die 208.

Figure 3:
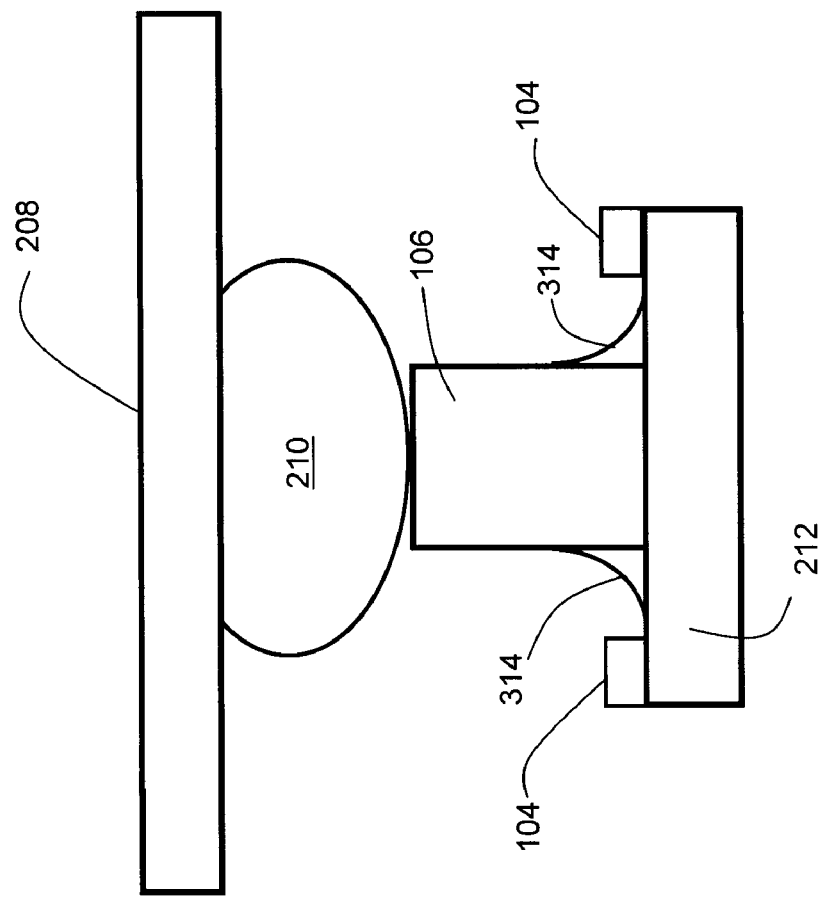
FIG. 3 shows a side view of a die placed on a substrate with partial reflow to perform a temporary chip attach, in accordance with the present invention.

FIG. 3 shows the die 208 attached to substrate pad 100 formed on substrate 212 using a temporary chip attach process. In this case, a partial reflow of C4 solder ball 210 has occurred. This creates a region of C4 solder 314 that surrounds column 106, makes contact with the substrate pad 100 and is stopped by the solder dam formed by outer region 104.

Figure 4:
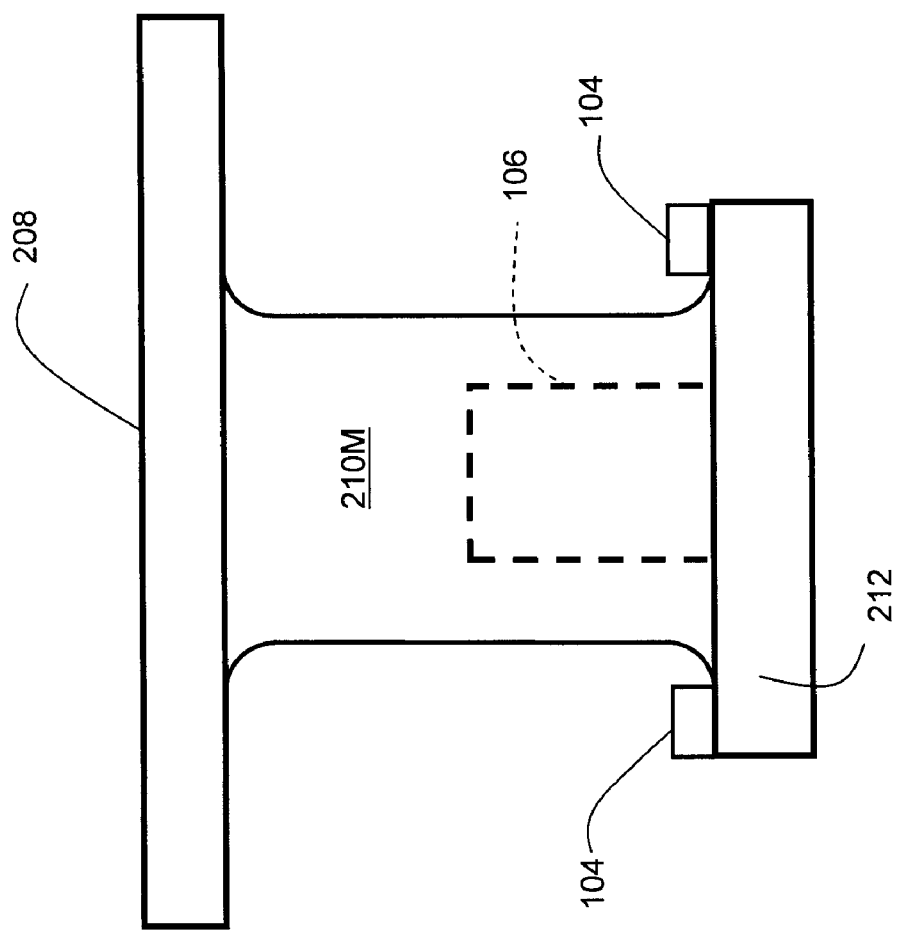
FIG. 4 shows a side view of a die placed on a substrate with complete reflow for a permanent attachment, in accordance with the present invention.

In some cases, it is desirable for the die 208 to be permanently attached to substrate 212, for example if testing indicates that the die 208 is a Known Good Die. In this case, , as shown in FIG. 4, a complete reflow is performed. The melted C4 solder ball, indicated as 210M, flows around the IMS column 106, and joins with the substrate 212 via substrate pad 100.

The present invention can be practiced with a wide variety of solder alloys. Both lead alloys, and lead-free alloys can be used.

In each of the following embodiments, the lead-free alloy is preferably comprised of one of the following solders:

SnAgCu (about 2.0% to about 4.0% Ag, about 0.2% to about 1.0% Cu, balance Sn), hereinafter referred to as SnAgCu;

SnCu (about 0.2% to about 1.0% Cu, balance Sn), hereinafter referred to as SnCu;

SnAg (about 2.0% to about 4.0% Ag, balance Sn), hereinafter referred to as SnAg;

SnAgIn (about 10% to about 20% In, 3% Ag, and the balance Sn), hereinafter referred to as SnAgIn;

SnBi (~57% Bi and the balance Sn), hereinafter referred to as SnBi;

SnZn (~9% Zn and the balance Sn), hereinafter referred to as SnZn;

SnIn (~52% In and the balance Sn), hereinafter referred to as SnIn.

In one embodiment, the IMS column 106 is made of high lead solder, such as Pb/Sn: 90/10, 95/5, or 97/3, and the C4 solder balls 210 are made of a lower lead solder such as Sn/Pb: 63/37. This produces a temperature hierarchy because the IMS column 106 will not melt at the C4 solder ball melting temperature of 183° C. Melting of the IMS column 106 occurs only at temperatures above 300° C.

In another embodiment, the IMS column 106 is made of high lead solder, such as Pb/Sn 90/10, 95/5, or 97/3, and the C4 solder balls 210 are made of a lead-free alloy such as SnAgCu, SnCu, SnAg, SnAgIn, SnBi, SnZn, or SnIn. This construction produces a temperature hierarchy because the IMS column 106 will not melt at the C4 solder ball 210 melting temperature, which ranges from between about 150° C. and 227° C. As with the previous embodiment, melting of the IMS column 106 occurs only at temperatures above about 300° C.

In yet another embodiment, the IMS column 106 is made of a lead-free alloy, such as AuSn: 80/20, and the C4 solder balls 210 are made of a lower melting lead-free alloy such as SnAgCu, SnCu, SnAg, SnAgIn, or SnBi. This produces a temperature hierarchy because the IMS column 106 will not melt at the C4 solder ball 210 melting temperature, which ranges from 152° C. to 227° C. Melting of the IMS column 106 occurs only at temperatures above 280° C.

In yet another embodiment, the IMS column 106 is made of a lead-free alloy, such as SnAgCu, SnCu, or SnAg, and the C4 solder balls 210 are made of a lower melting lead-free alloy such as SnZn, SnBi, or SnIn. This construction has a temperature hierarchy because the IMS column 106 will not melt at the C4 solder ball 210 melting temperature, which ranges from about 150° C. to about 180° C. Melting of the IMS column 106 occurs only at temperatures above about 217° C.

Figure 5:
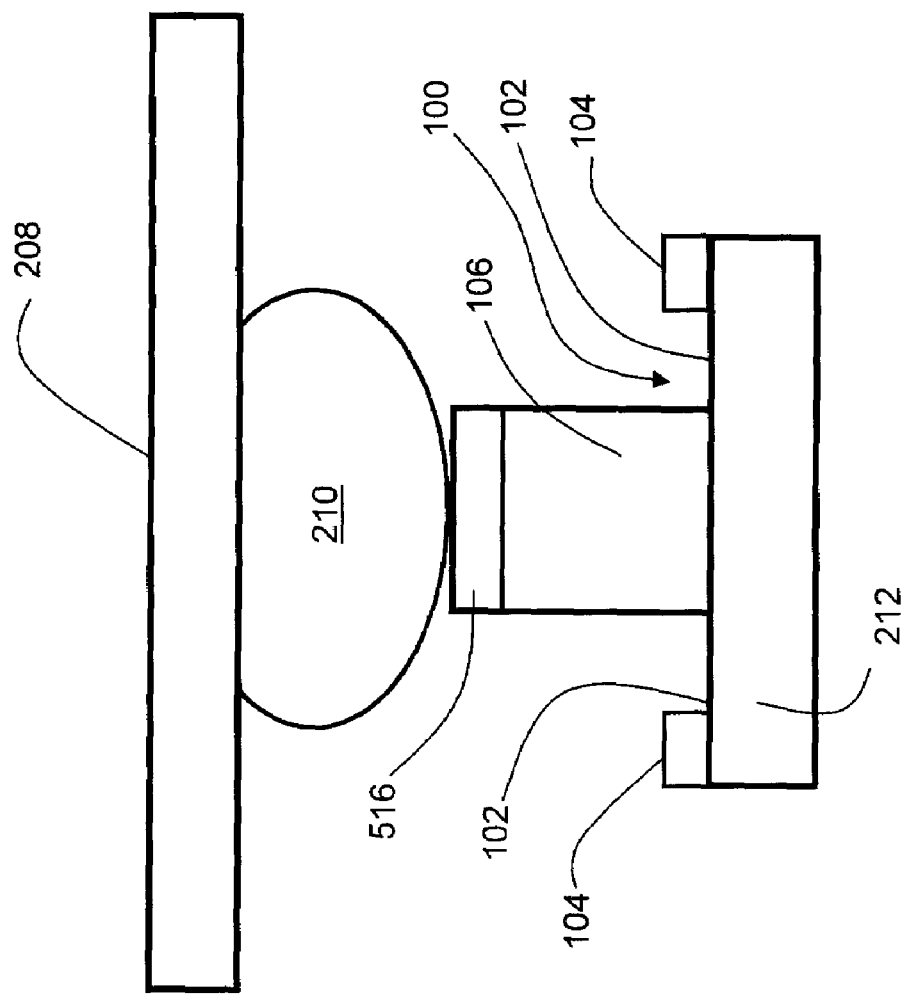
FIG. 5 shows a side view of a die placed on a substrate with an intermediate solder material, in accordance with the present invention.

As previously mentioned, if the gap of the C4 material is too low for an easily controlled reflow, an intermediate material is used. This is indicated in FIG. 5. In this case, intermediate material 516 has a lower melting point than C4 solder ball 210. Intermediate material 516 is partially reflowed to provide a TCA connection. If it is desired to permanently attach the die 208 to the substrate 212, then the C4 solder ball 210 is completely reflowed as in the previous example.

As mentioned previously, there are two methods suitable for removing the die 208 from the substrate.

Figure 6:
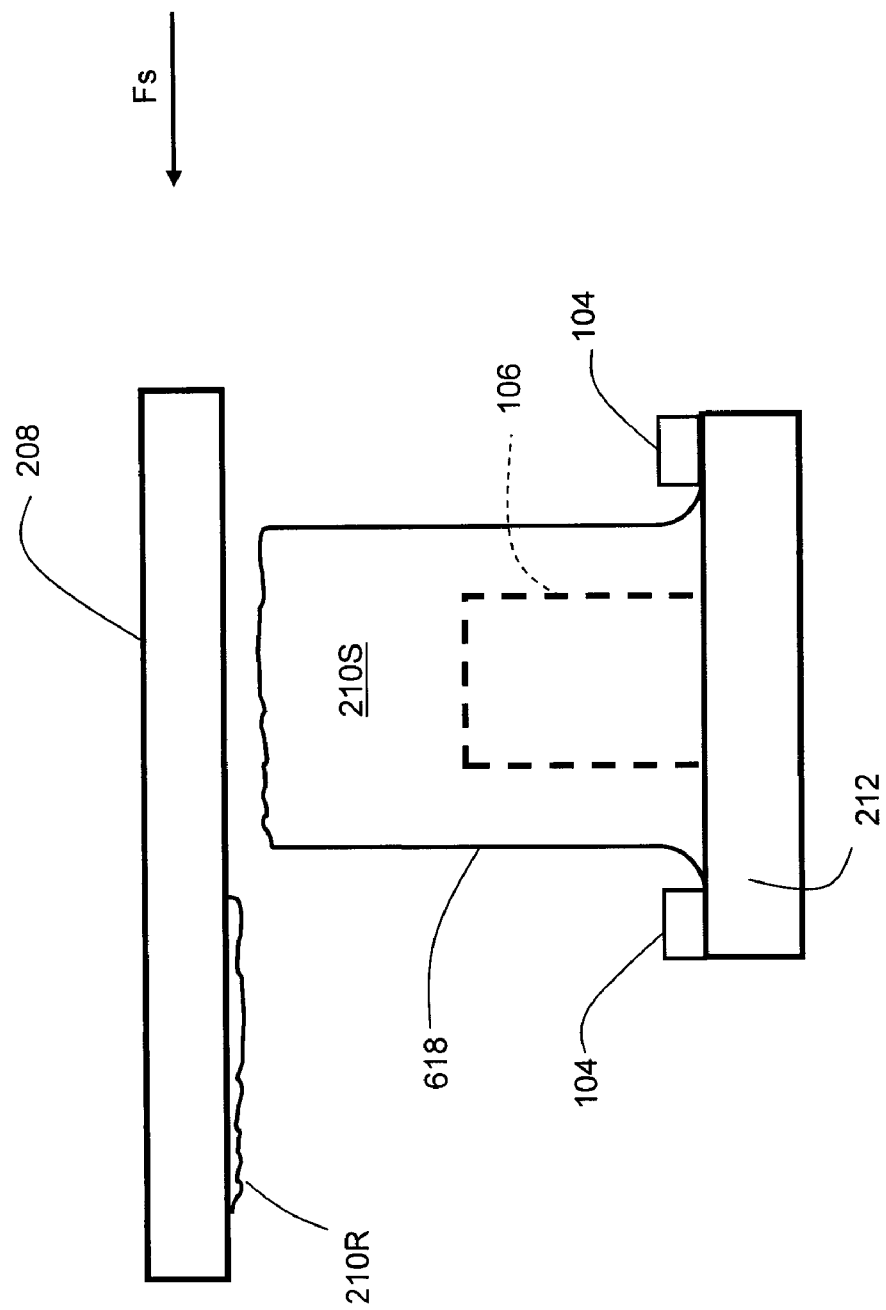
FIG. 6 shows a shear method for removal of a die.

In FIG. 6, a shear removal method is shown. The die 208 is moved in a direction Fs, which is substantially perpendicular to the outer wall 618 of column 210S. The die 208 is moved using standard die-handling apparatuses (not shown) that are known in the art. Typically, the die 208 is gripped by mechanical grippers or a vacuum nozzle that is attached to a servo controlled mechanism which is part of a die-handling apparatus. The die-handling apparatus applies force in the direction Fs, thereby breaking the bond formed by column 210M (FIG. 4). A small portion of the column 210R remains on die 208. This column portion 210R will melt during reflow when die 208 is permanently attached on another substrate.

Figure 7:
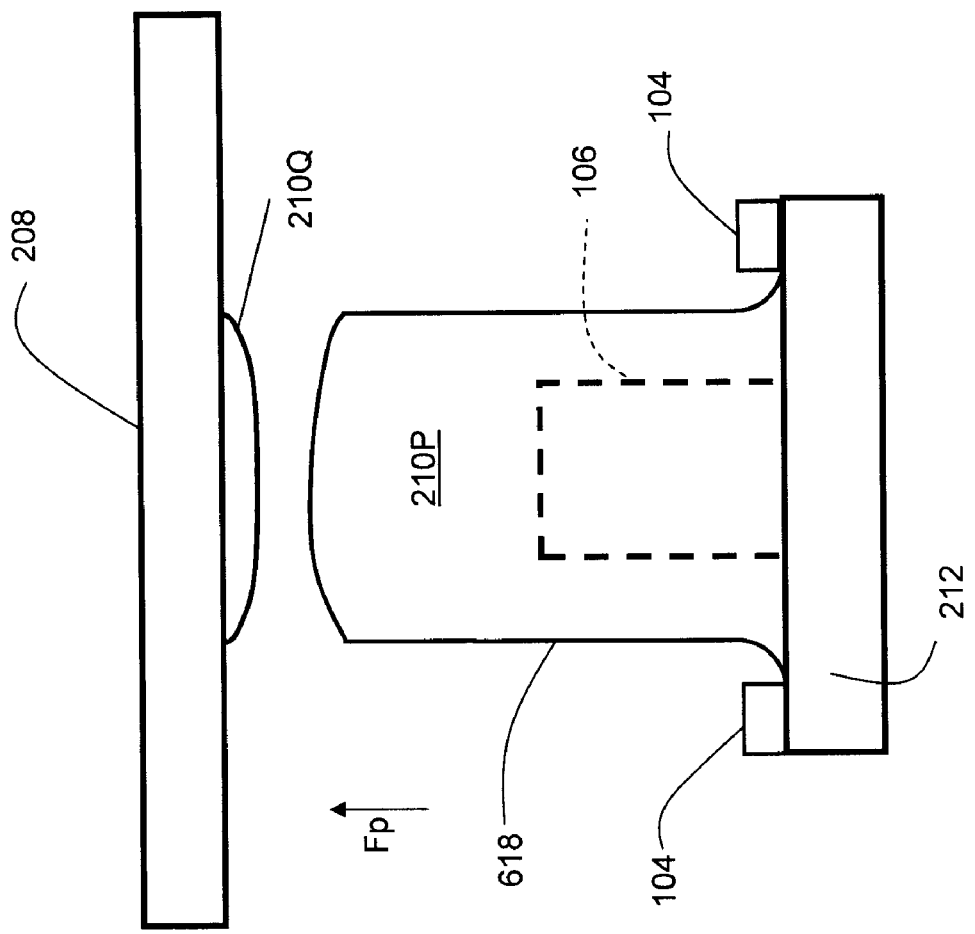
FIG. 7 shows the pull method for removal of a die.

FIG. 7 shows the pull method for removal of die 208. In this case, the die 208 is moved in direction Fp, which is approximately parallel to outer wall 618 of column 210P. The die 208 is moved using standard die-handling apparatuses that are known in the art. Typically, the die 208 is gripped by mechanical grippers or a vacuum nozzle that is attached to a servo controlled mechanism which is part of a die-handling apparatus. After performing a partial reflow to soften the bond of column 210M (FIG. 4), the die-handling apparatus applies force in the direction Fp, thereby breaking the bond formed by column 210M (FIG. 4). A small portion of the column 210Q remains on die 208. This column portion 210Q will melt during reflow when die 208 is permanently attached on another substrate. Note that while Fp is shown as substantially parallel to outer wall 618, the direction with respect to outer wall 618 is not so critical. Force applied in a direction deviating from Fp by up to 40 degrees can still be used to properly remove die 208 using this method.

Figure 8:
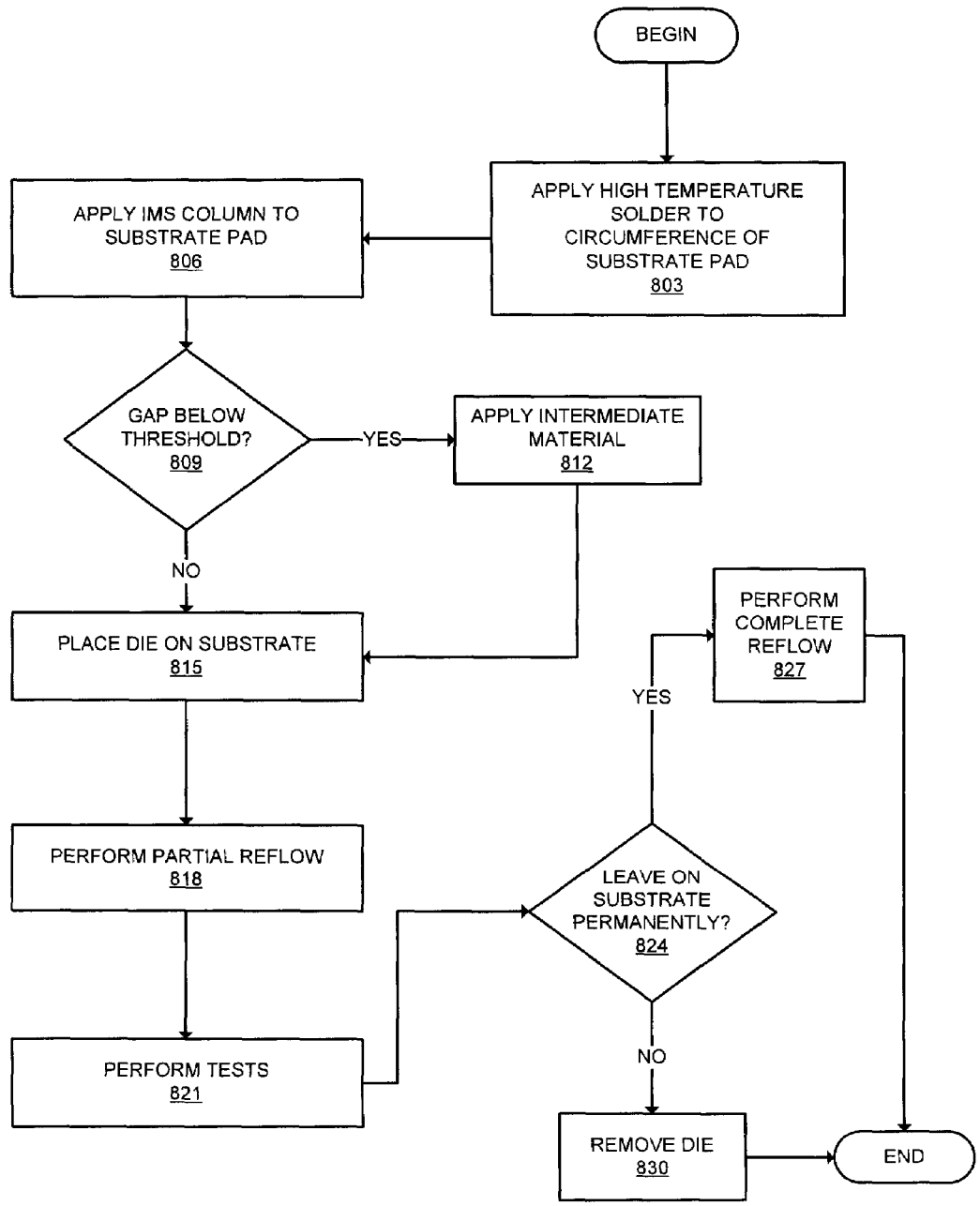
FIG. 8 shows a flowchart indicating the sequence of steps used to perform the method of the present invention.

FIG. 8 shows a flowchart indicating the sequence of steps used to perform the method of the present invention. In step 803, the pad 100 of a substrate 212 is prepared by applying high temperature solder around the circumference of a substrate pad. This high temperature solder is indicated as reference 104 in FIG. 1, and is generally comprised of the same materials as the column 106 (FIG. 2). In step 806, an IMS column 106 (FIG. 2) is applied to the substrate pad 100 that has been prepared in step 803. As stated previously, the difference between the solidus and liquidus temperatures is referred to as the gap. In step 809, the gap is evaluated to see if it is below a predetermined threshold. For example, in an exemplary embodiment of the invention, the threshold is set at 15° C. Then, if the gap of the C4 solder bumps 210 (FIG. 2) is less than 15° C., an intermediate material is applied to the top of the IMS column in step 812. The threshold is determined primarily by the capabilities of the manufacturing equipment. For example, if the gap is 15° C., and the precision of the oven is plus or minus 25° C., then the threshold is set to 25° C., and it is desirable to use the intermediate material, since it would not be possible to perform a controlled partial reflow with that oven. However, if the precision of the oven is plus or minus 3° C., then the threshold is set to 3° C., and if the gap is 15° C., the intermediate material is not required, since the oven is capable of performing a controlled partial reflow of a material with a gap of 15° C. The intermediate material is shown as 516 in FIG. 5. The die 208 is then placed on the substrate pad 100 of substrate 212 (FIG. 2) in step 815. If the gap is sufficient, then step 812 is skipped, and the method proceeds directly from step 809 to step 815. A partial reflow is then performed in step 818. At this point, the die 208 is electrically connected to the substrate 212 (FIG. 3), and any desired electrical tests may be performed. Once testing is complete, the method proceeds to step 824 to determine if the die 208 should be removed from the substrate 212. If the die 208 fails the tests, then it will likely be removed. If the die 208 passes the tests, it may be desirable to remove the die 208 and place it in a known good die bank. Alternatively, if the die 208 is known to be good, it may be desirable to permanently attach it to the substrate 212 (see FIG. 4). The present invention can accomplish either of these outcomes. If it is desired to permanently attach the die 208 to the substrate 212, a complete reflow is performed in step 827. If it is desired to remove the die 208 (FIG. 2), removal is performed in step 830. The method of removal can be a removal method such as shear, or slight reflow and pull can be applied to remove the die 208 along with the C4 solder from the IMS column, see FIGS. 6 and 7.

As can be seen from the preceding description, the present invention provides an improved method for performing a temporary chip attach. The complexity of the temporary chip attach process is reduced, which allows a more efficient testing of die, and aids in establishing a supply of Known Good Die. It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method of attaching a chip to a substrate, said method comprising the steps of:
    forming at least one substrate pad on the substrate by applying a ring of high temperature solder to said substrate to form an outer region of high temperature solder;
    applying low temperature solder within said outer region of high temperature solder to form an inner region of low temperature solder;
    placing one end of an injection molded solder column on the inner region of said substrate pad, whereby said column does not contact said outer region;
    mounting said chip onto an opposite end of the injection molded solder column with a C4 solder ball whereby the chip makes electrical contact with the injection molded solder column; and
    performing a partial reflow at a temperature between about 150° C. and 227° C. whereby said C4 solder ball wets both the inner and outer regions of the substrate pad and forms a joint between the inner region and a lower side wall of the injection molded solder column.

2. The method of claim 1, further comprising the steps of:
    testing said chip; and
    removing said chip from the injection molded solder column.

3. The method of claim 1, further comprising the steps of:
    testing said chip; and
    performing a complete reflow at a temperature between about 1500C. and 2270C., thereby permanently attaching said chip to the injection molded solder column.

4. The method of claim 1, further comprising the step of:
    depositing an intermediate material of a low temperature solder having a lower melting point than C4 solder ball on the injection molded column between the column and the C4 solder ball.

5. The method of claim 4, further comprising the steps of:
    testing said chip, and then removing said chip from the injection molded solder columns.

6. The method of claim 4, further comprising the steps of:
    testing said chip, and then performing a complete reflow at a temperature between about 1500 C. and 2270 C., thereby permanently attaching said chip to the injection molded solder column.

7. The method of claim 1, including the step of selecting the injection molded solder column from a material:
    having a composition of between about 90.0 to 97.0% Pb and between about 10.0 to 3.0% Sn; and
    having a melting temperature greater than about 300° C.

8. The method of claim 7, wherein said electrical contacts of said chip are comprised of a solder composition of about 63.0% Sn and about 37% Pb; and wherein the solder composition has a melting temperature of less than about 220° C.

9. The method of claim 1 including the step of selecting the injection molded solder column from a material:

having a composition of between about 80.0% Au and about 20% Sn; and having a melting temperature greater than 280° C.

10. The method of claim 1 including the step of selecting the injection molded solder column from a material:

selected from the group of materials consisting essentially of SnAgCu, SnCu, and SnAg; and having a melting temperature greater than about 217° C.

11. The method of claim 10 including the step of forming said electrical contact of said chip from the group of materials consisting essentially of SnZn, SnBi, and SnIn; and having a melting temperature greater than about 150° C. and less than about 180° C.

12. The method of claim 10 including the step of forming said electrical contact of said chip from the group of materials consisting essentially of SnAgCu, SnCu, SnAg, SnAgIn, SnBi, SnZn, and SnIn; and having a melting temperature greater than about 150° C. and less than about 227° C.

13. The method of claim 7 wherein said electrical contacts of said chip are formed from the group of materials consisting essentially of SnAgCu, SnCu, SnAg, SnAgIn, SnBi, SnZn, and SnIn; and having a melting temperature greater than about 150° C. and less than about 227° C.

14. The method of claim 4, wherein said intermediate material is formed from the group of materials consisting essentially of SnZn, SnBi, and SnIn; and having a melting temperature greater than about 150° C. and less than about 180° C.

15. The method of claim 2, wherein the step of removing said chip from the injection molded solder columns is performed by a shear method.

16. The method of claim 2, wherein the step of removing said chip from the injection molded solder columns is performed by a pull method.

17. The method of claim 1, wherein said high temperature solder:

has a composition of between 90.0 to 97.0% Pb and between 10.0 to 3.0% Sn; and said composition has a melting temperature greater than about 300° C.

18. The method of claim 1, wherein said high temperature solder:

has a composition of 80.0% Au and 20% Sn; and said composition has a melting temperature greater than about 280° C.

19. The method of claim 1, wherein said high temperature solder:

is formed from the group of materials consisting essentially of SnAgCu, SnCu, and SnAg; and has a melting temperature greater than about 217° C.

* * * * *